US005808503A

United States Patent [19]

Miyazaki

[11] Patent Number: 5,808,503

[45] Date of Patent: Sep. 15, 1998

[54] INPUT SIGNAL PROCESSING CIRCUIT

[75] Inventor: Takahiro Miyazaki, Hiji-Machi, Japan

[73] Assignee: Texas Instruments Incorporated, Dallas, Tex.

[21] Appl. No.: 632,039

[22] Filed: Apr. 12, 1996

[30] Foreign Application Priority Data

Apr. 12, 1995 [JP] Japan .................................... 7-086901

[51] Int. Cl.[6] ............................. H03K 17/60; H03K 3/26

[52] U.S. Cl. ........................... 327/375; 327/478; 327/540

[58] Field of Search ..................................... 327/362, 375, 327/378, 381, 478, 482, 484, 487, 488, 489, 490, 486, 539, 540, 545, 538, 579, 584, 585; 323/315, 316; 330/257, 288

[56] References Cited

U.S. PATENT DOCUMENTS 4,450,366 5/1984 Malhi et al. ............................ 327/538
4,739,190 4/1988 Alzati et al. ............................ 327/375
5,036,218 7/1991 Jaquette .................................. 327/375
5,481,216 1/1996 Yeung .................................... 327/375

*Primary Examiner*—Timothy P. Callahan
*Assistant Examiner*—Eunja Shin
*Attorney, Agent, or Firm*—Gerald E. Laws; William B. Kempler; Richard L. Donaldson

[57] ABSTRACT

An input signal processing circuit which prevents saturation of the input transistor. It has an input npn transistor QN1, a transistor QP1, the emitters of which are connected to the cathode terminal $T_{CTD}$, and the collectors of which are connected to the collector of the input transistor. Transistors QP2,QP3 have emitters connected to the cathode terminal $T_{CTD}$, and bases connected to the bases of transistor QP1. Transistor QN2 has its emitter connected to anode terminal $T_{AND}$ via resistor R5 and its collector connected to a common connecting point with the bases of transistors QP1,2. Transistor QN3 has its emitter connected to the anode terminal $T_{AND}$, its base connected to the base of transistor QN2, and its collector connected to base and the collector of transistor QP2. A resistor R4 is connected between the collector of input transistor QN1 and the collector of third transistor QN2.

8 Claims, 2 Drawing Sheets

INPUT SIGNAL PROCESSING CIRCUIT

FIELD OF THE INVENTION

My invention relates to an input signal processing circuit for three-terminal voltage regulators, amplifiers, and the like.

BACKGROUND OF THE INVENTION

Three-terminal voltage regulators are often used for low voltage applications, and those with 2.5 V output specifications are common. FIG. 3 shows an example of a three-terminal regulator $REG_a$ with a 2.5 V output specification. $REG_a$ has two transistor stages and provides a high input impedance at an input terminal $T_{VREF}$.

$REG_a$ has five npn transistors Q1–Q5, two pnp transistors Q6,Q7 and a resistor R1 that make up a current mirror, as well as the 1.25 V bandgap reference circuit BG. The base of transistor Q1 is connected to input terminal $T_{VREF}$ to receive an input voltage $V_{REF}$. The collectors of npn transistors Q1,Q4,Q5 and the emitters of pnp transistors Q6,Q7 are connected to a cathode terminal $T_{CTD}$. The emitters of npn transistors Q3,Q5 and one terminal of the bandgap circuit BG are connected to an anode terminal $T_{AND}$.

In $REG_a$ the emitter of input transistor Q1 is connected to the base of transistor Q2, and by constructing a current source with two transistor stages, a circuit with a high input impedance at input terminal $V_{REF}$ is realized for a 2.5 V output.

Because there is a trend toward using a lower supply voltage of 3 V, the demand for a good three-terminal regulator with a 1.25 V output specification has increased, along with a demand for higher precision in the output voltage. However, because the typical transistor's forward-biased base to emitter voltage $V_{BE}$ is about 0.7 V, such a conventional two-stage circuit design cannot meet the demand for a low voltage specification of 1.25 V.

Thus, a three-terminal voltage regulator $REG_b$ with a single-stage transistor construction, such as that shown in FIG. 4, has been considered to satisfy the demand for a 1.25 V output specification. In $REG_b$, the collector and base of a pnp transistor Q6, that makes up a current mirror with pnp transistor Q7, are connected to the collector of an npn input transistor Q1. Resistors R2,R3 are connected in series between the emitter of Q1 and an anode terminal $T_{AND}$. The voltage across resistor R2 is input to a 1.25-V bandgap circuit 1, and a current $I_{01}$ is made to flow in the collector side of transistor Q7.

When the input voltage $V_{REF}$ is gradually increased from 0 V, the base voltage of npn transistor Q1 rises, and current I1 begins to flow in resistors R2,R3.

Because the emitter current of input transistor Q1 is supplied from the collector of transistor Q6, the base voltage of the pnp transistors Q6,Q7 is pulled down. As a result, transistors Q6,Q7 shift into the ON state, and a current $I_{01}$ begins to flow in the collector of transistor Q7.

However, in the circuit of FIG. 4, when the input transistor Q1, the base of which is connected to the input terminal $T_{VREF}$, results in a voltage as an output voltage, in other words, the cathode voltage, being 1.25 V or close to 1.25 V, it is completely saturated, the problem presented below arises.

For example, when input voltage $V_{REF}$ equals the voltage of output cathode terminal $T_{CTD}$ (e.g., 1.25 V), if the base-emitter voltage $V_{BE}$ of the transistors is about 0.7 V, the voltage of node N1 becomes (1.25 V$-V_{BE}$)=0.55 V, while the voltage of node N2 becomes (1.25 V$-V_{BE}$)=0.55 V, making them equal. Therefore, input transistor Q1 completely saturates, its current gain $h_{fe}$ becomes low, and its required input base current $I_i$ becomes large. This reduces the collector current in transistor Q6 and its mirror current $I_{01}$ in the collector of transistor Q7.

When the output voltage is close to 1.25 V, if the setup output voltage is $V_0$, the current $I_i$ that flows into input terminal $T_{VREF}$, as mentioned above, becomes large because the input transistor Q1 is saturated.

Ordinarily, in the case of a "programmable zener" reference circuit like that shown in FIG. 5, if the "zener" (made from a bandgap reference circuit) turns on when the control voltage $V_{REF}$ reaches 1.25 V, the zener output voltage $V_0$ can be derived with the following equation.

$$V_0=(1+R_a/R_b)\cdot(1.25)\ \text{Volts} \qquad \text{(Eq. 1)}$$

where, $R_a$ and $R_b$ are the resistances of resistors Ra,Rb.

However, in the circuit of FIG. 4, due to the influence of current $I_i$ that flows into input terminal $T_{VREF}$, in actuality, an error of $(I_i\cdot R_a)$ is generated in the output voltage as shown in the following equation.

$$V_0=(1+R_a/R_b)\ (1.25)+(I_i\cdot R_a)\ \text{Volts} \qquad \text{(Eq. 2)}$$

Therefore, an accurate output voltage cannot be obtained with the circuit of FIG. 4.

Therefore, an object of my invention is to provide an input signal processing circuit which, from the very beginning, can realize low voltage operations, prevent its input transistor from saturating, and provide an accurate output voltage.

SUMMARY OF THE INVENTION

The input signal processing circuit of my invention has an input transistor, to the base of which the input signal is supplied, and which outputs a current in response to the signal level from the emitter; a first transistor connected to the power supply, the emitter of which is connected to a first power supply, and the collector of which is connected to the collector of the input transistor; a second transistor, the emitter of which is connected to the first power supply, and the base of which is connected to the base of the first transistor; a third transistor, the emitter of which is connected to a second power supply through a first resistor, and the collector of which is connected to a connecting point that is common with the base of the second transistor; a fourth transistor, the emitter of which is connected to the second power supply, the base of which is connected to the base of the third transistor, and the collector of which is connected to its base and the collector of the second transistor; and a first circuit connected between the collector of the input transistor and the collector of the third transistor, and along with being electrically connected between both collectors, generates a potential difference in response to the current that flows in the collector of said third transistor.

The first circuit has a second resistor connected between both of the collectors, the emitter ratio of the first transistor and second transistor is set to be M:1, and the emitter ratio of the third transistor and fourth transistor is set to be some suitable multiple N:1, such as 2:1, 5:1, 10:1 etc.

My invention provides a second circuit which lowers the base voltage of the third and fourth transistors if the base voltage of the input transistor and the second power supply voltage are almost equal.

The second circuit has a Schottky diode connected between the common base connecting point of the third and fourth transistors so as to be in the forward direction from said common base connecting point toward the base of the input transistor.

When the input signal level and the level of the first power supply are equal or almost equal, if the input signal level that is supplied to the base of the input transistor is gradually increased from 0V, the base voltage of the input transistor increases, and current begins to flow on its emitter side.

Since the emitter current of the input transistor is supplied from the collector of the input transistor, the collector of the input transistor lowers the base voltage of the first and second transistors, for example, through the first circuit.

The collector of the second transistor is connected to the base and collector of the fourth transistor and the base of the third transistor, and supplies the prescribed current.

In this way, the third and fourth transistors are turned on, and the prescribed current flows in the collector of the second transistor.

Because the collector of the third transistor is connected to the bases of the first and second transistor, the second transistor, the third transistor, and the fourth transistor enter the latched state, and current continues to flow normally in the circuit.

If it is assumed that the current gain $h_{fe}$ of the first and second transistors is sufficiently high, and that base current can be ignored, the collector current of the third transistor is supplied through the first circuit from the collector of the first transistor.

Therefore, the desired potential difference is created between the collector of the input transistor and the collector of the third transistor due to the first circuit.

Because the collector of the first transistor is connected to the collector of the input transistor, the collector-emitter voltage $V_{CE}$ becomes larger in accordance with the voltage increase due to the first circuit, and is made to operate normally by exiting the saturated state.

Therefore, the current gain $h_{fe}$ of the input transistor becomes large, as is normal, the base terminal enters the high impedance state, and the base current becomes small.

In the figures, $REG_c$ is a three-terminal regulator, $T_{VREF}$ an input terminal, $T_{AND}$ an anode terminal, $T_{CTD}$ a cathode terminal, BG a bandgap circuit, QN1–QN4 npn transistors, QP1 a pnp transistor group, QP1*a*, QP1*b*, QP2, QP3 pnp transistors, R2,R3,R4,R5 resistors, and DS1 a schottky diode.

DESCRIPTION OF EMBODIMENTS

Figure 1:
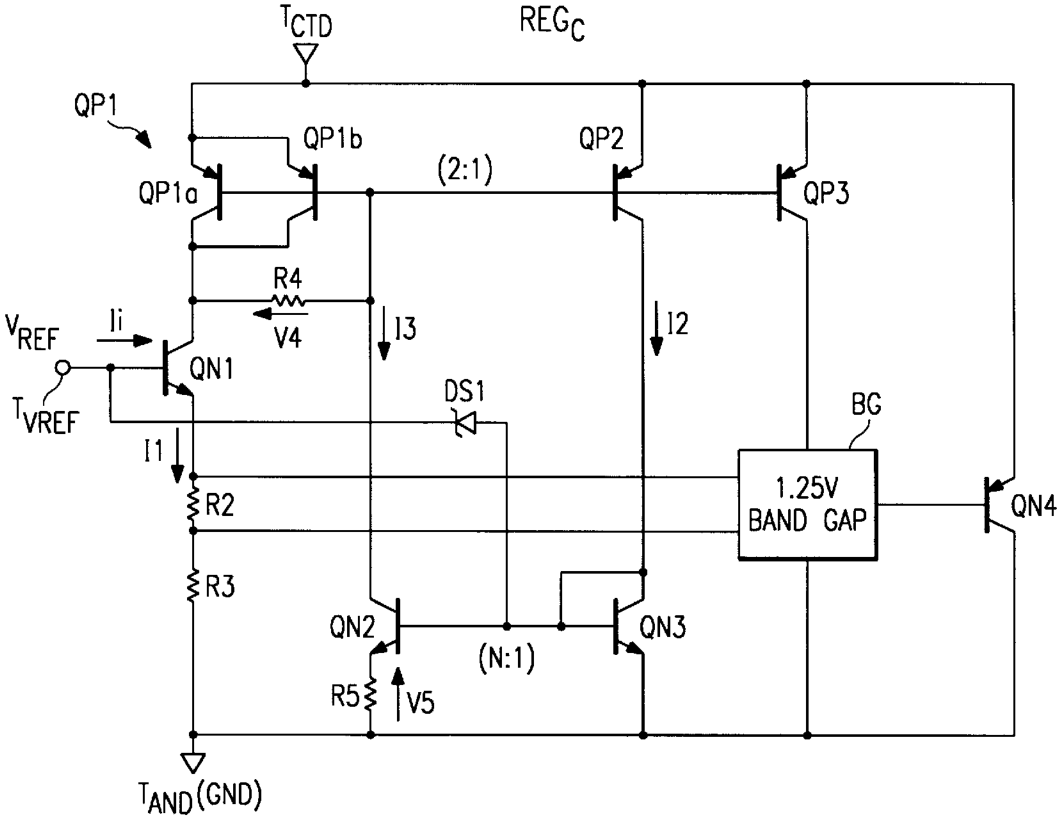
FIG. 1 is a schematic of a first embodiment of an input signal processing circuit according to my invention.
Figure 4:
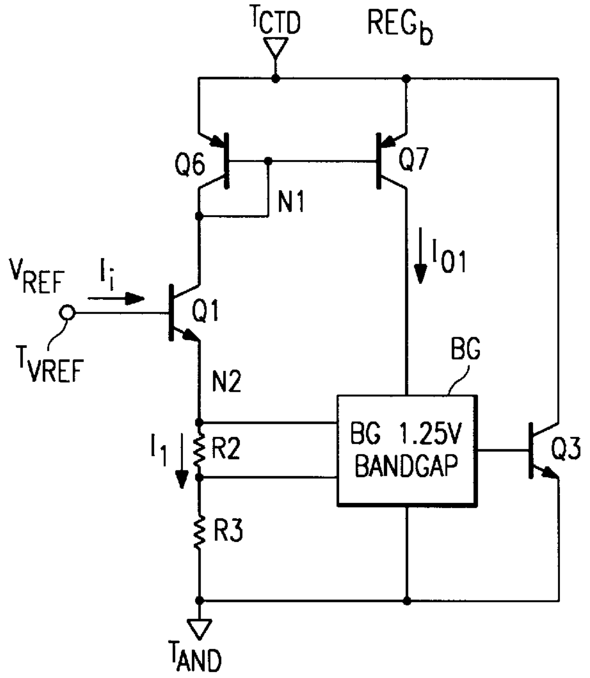
FIG. 4 is a schematic of a three-terminal regulator with 1.25 V specifications.

FIG. 1 shows an embodiment of an input signal processing circuit according to my invention, a 1.25-V output regulator circuit $REG_C$. In FIG. 1, parts that are the same as those in FIG. 4 have the same reference numerals.

In this circuit, $T_{VREF}$ is an input terminal, $T_{AND}$ an anode terminal, and $T_{CTD}$ a cathode terminal. BG is a 1.25-V bandgap circuit, QN1–QN4 are npn transistors, QP1 is a pnp transistor group, QP1*a*,QP1*b*,QP2,QP3 are pnp transistors, R2,R3,R4,R5 are resistors, and DS1 is a Schottky diode.

Input transistor QN1 has its base connected to input terminal $T_{VREF}$ and the cathode of Schottky diode DS1. The collector of QN1 is connected to the collectors of pnp transistors QP1*a*,QP1*b* of a transistor group QP1 that is provided in parallel, and to one terminal of a resistor R4. Resistors R2,R3 are connected in series between the emitter of QN1 and anode terminal $T_{AND}$, and the two ends of resistor R2 are connected to the two input terminals of a bandgap circuit BG.

The emitters of pnp transistors QP1*a*,QP1*b*,QP2,QP3 and the collector of npn transistor QN4 are connected to the cathode terminal $T_{CTD}$, and the bases of transistors QP1*a*, QP1*b*,QP2,QP3, along with being connected together, are connected to the other end of resistor R4 and the collector of npn transistor QN2. The emitter of npn transistor QN2 is connected to one terminal of resistor R5. The base of QN2 is connected to the base of npn transistor QN3 and the anode of Schottky diode DS1. The collector of QN3 is connected to its base and the collector of pnp transistor QP2.

A pseudo-current mirror is constructed by means of npn transistors QN2 and QN3. The emitters of transistors QN3, QN4, the other terminal of resistor R5, and one terminal of the bandgap circuit BG are connected to the anode terminal $T_{AND}$. The emitter ratio of npn transistors QN2 and QN3 which make up the current mirror is set to N:1, and the emitter ratio of pnp transistor group QP1 and pnp transistor QP2 is set to M:1, for example, 2:1.

Suppose the voltages of input terminal $T_{VREF}$ and cathode terminal $T_{CTD}$ are almost equal, or a cathode voltage that is equal to the output voltage is set. If the input voltage $V_{REF}$ to terminal $T_{VREF}$ is gradually increased from 0 V, the base voltage of npn transistor QN1 rises, and a current I1 begins to flow through resistors R2,R3. Because emitter current I1 of QN1 is supplied from its collector which draws current through resistor R4, this lowers the common base voltage of transistor group QP1 and transistors QP2,QP3.

The collector of transistor QP2, which is connected to the base and collector of npn transistor QN3 and the base of transistor QN2, supplies current I2. In this way, transistors QN2,QN3 are turned on, and current I3 flows in the collector of transistor QN2.

The emitter ratio of transistor QN2 and transistor QN3 is N:1, and the emitter of transistor QN2 is connected to the anode terminal $T_{AND}$, in other words, ground GND, through resistor R5.

Because the collector of transistor QN2 is connected to the bases of transistors QP1,QP2,QP3, transistors QP2,QN3, QN2 enter the latched state, and current continues to flow normally through the circuit. At this time, current flows to the bandgap circuit BG from the collector of transistor QP3.

Assuming that the current gain $h_{fe}$ of transistors QP1, QP2,QP3 is sufficiently large, and that the base current can be ignored, collector current I3 of transistor QN2 is supplied from the collectors of transistors QP1*a*,QP1*b* of pnp transistor group QP1 through resistor R4. Therefore, if the voltage across both ends of the resistor R4 is V4, a voltage difference of $V4=R4 \cdot I3$ is created.

Because the collector of transistor QP1 is connected to the collector of transistor QN1, the collector-emitter voltage $V_{CE}$ of transistor QN1 becomes larger depending on the increase of voltage V4, and is thereby adjusted so that normal operation is conducted by exiting the saturated state.

Therefore, the current gain $h_{fe}$ of input transistor QN1 becomes larger than normal, the base terminal enters a high input impedance state, and base current $I_i$ becomes small.

Suppose the emitter ratio M of QP1,QP2 as 2:1, the current flowing in QP2 is I2, the emitter ratio N of QN2,QN3 is N:1, the current gain $h_{fe}$ is sufficiently large, and $I_S$ of transistor QN3 is $I_{SQN3}$. Then base-emitter voltage $V_{BEQN3}$ of transistor QN3 can be obtained by the following equation.

$$V_{BEQN3}=V_T \ln (I2/I_{SQN3}) \quad \text{(Eq. 3)}$$

Also, the collector current of transistor QN2, as shown by the following equation, is different from the collector current $I_{QP1}$ of transistor QP1 and the collector current $I_{QN1}$ of the collector of transistor QN1.

$$I3=I_{QP1}-I_{QN1}=2\cdot I2-I1 \quad \text{(Eq. 4)}$$

At this time, if the $I_S$ of transistor QN2 is $I_{SQN2}$, the base-emitter voltage $V_{BE}$ of transistor QN2 can be obtained by the following equation.

$$V_{BEQN2}=V_T (\ln) (I3/I_{SQN2}) \quad \text{(Eq. 5)}$$

Also, if the voltage across resistor R5 is V5, the current I3 that flows in transistor QN2 can be found with the following equation.

$$I3=(V_{BEQN3}-V_{BEQN2})/R5 \quad \text{(Eq. 6)}$$

Where R5 shows the resistance of resistor R5.

Equation (6) can be rewritten as the following equation from the equations (3) and (5):

$$I3=\{V_T \ln (I2/I_{SQN3}) -V_T \ln (I3/I_{SQN2})\}/R5 \quad \text{(Eq. 7)}$$

Also, because of the equation 4 and the emitter ratio of transistors QN2,QN3 being N:1, the $I_S$ of transistor QN2 becomes N times the $I_S$ of transistor QN3, and the current I3 that flows in transistor QN2 becomes that shown in the following equation:

$$\begin{aligned} I3 &= \{V_T \ln) (I2/I_{SQN3}) - V_T \ln ((2\cdot I2 - I1)/I_{SQN2})\}/R5 \quad \text{(Eq. 8)} \\ &= (V_T/R5)\{\ln I2 - (\ln (2\cdot I2 - I1) + \ln N\} \end{aligned}$$

For the sake of convenience, if I1=I2, the equation 8 becomes:

$$I3=(V_T/R5) \ln N \quad \text{(Eq. 9)}$$

Therefore voltage V4 can be obtained as:

$$V4=R4\cdot I3=(R4/R5)\, V_T \ln N \quad \text{(Eq. 10)}$$

By setting the resistances R4,R5 of resistors R4,R5 and the emitter ratio N of transistors QN2,QN3 such that the voltage V4 does not exceed 0.2 V, the saturation state of transistor QN1 can be prevented by setting the collector-emitter voltage $V_{CE}$ for input transistor QN1 high. In this way, input transistor QN1 is operated normally.

Figure 2:
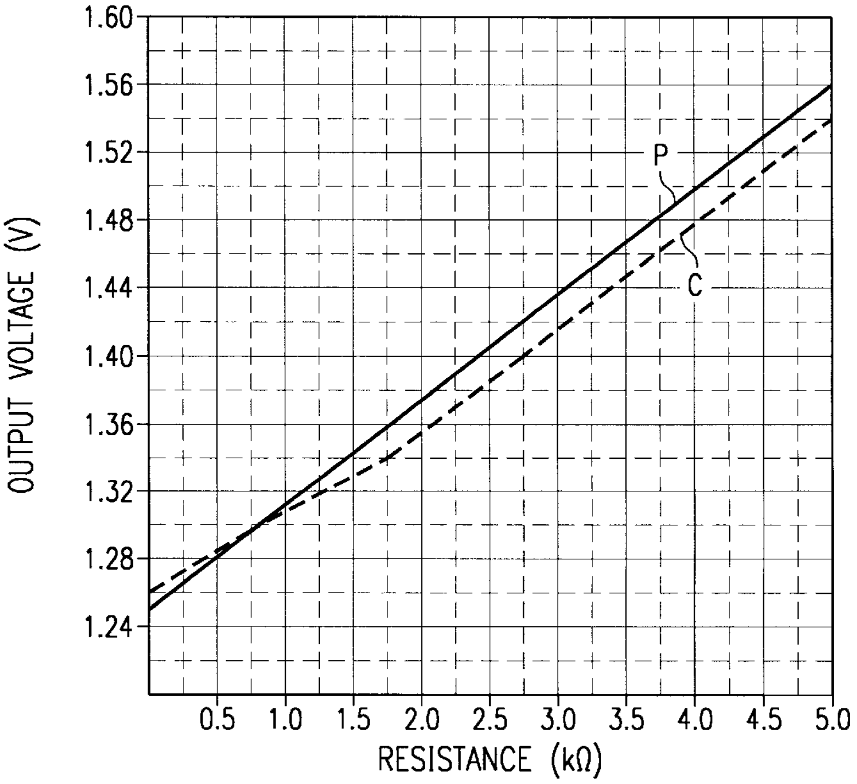
FIG. 2 is a graph comparing the output voltage vs. resistance characteristics of my circuit of FIG. 1 that uses saturation countermeasures for the input transistor with a conventional circuit.
Figure 3:
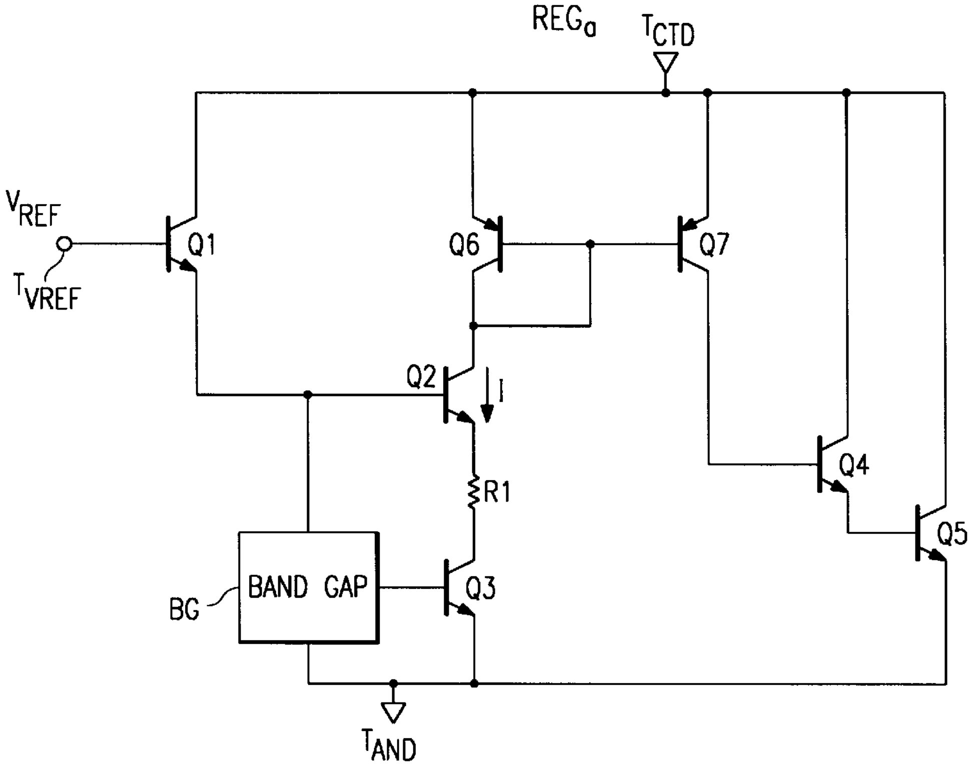
FIG. 3 is a schematic of a conventional three-terminal regulator with 2.5 V specifications.
Figure 5:
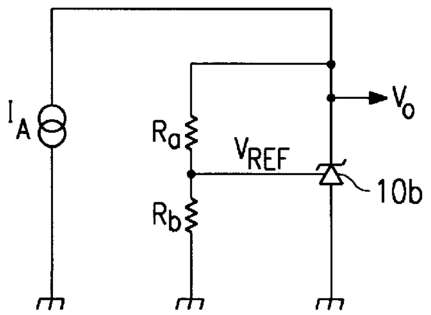
FIG. 5 is a diagram for explaining the problems with the conventional technology.

FIG. 2 is a diagram showing the output voltage characteristics in FIG. 1, wherein the saturation countermeasures for the input transistor QN1 were employed, and in the case where Rb was set to 20 kΩ and Ra was varied in the experimental circuit of FIG. 5, which was used as the conventional circuit in which the countermeasures were not employed.

As shown in FIG. 2, in contrast to the fact that, in the conventional circuit, which is shown by curve C, distortion is created in the low voltage region where the cathode voltage is below about 1.32 V, in the circuit of FIG. 1, which is shown by the curve P, there is no distortion even in the low voltage region, and it has linear characteristics.

Also, if the input terminal $T_{VREF}$ and the anode terminal $T_{AND}$ are shorted, because the base voltage of transistors QN2,QN3 are pulled down by the Schottky diode DS1 connected to the input terminal $T_{VREF}$, the circuit is shut down, and absolutely no current flows.

As explained above, according to this embodiment, the input transistor QN1 can be prevented from becoming saturated, an ordinary current gain $h_{fe}$ of the input transistor can be obtained, the input impedance of the base terminal of input transistor QN1 is increased, and the base current can be reduced.

Because of this, the output voltage, even during low output voltage, can be accurately output in the same manner as with an ordinary output voltage.

In this embodiment, the emitter ratio of pnp transistors QP1,QP2 was set to 2:1, but when the collector current of transistor QP1 is larger than the collector current of transistor QN1, it operates normally. Therefore, the emitter ratio of the transistors is not limited to 2:1.

Also, in this embodiment, an example of a three-terminal regulator was explained, but it is not limited to this, and needless to say, my invention can be broadly applied to low-voltage operating circuits, such as input circuits of low-voltage amplifiers and the like.

As explained above, according to the input signal processing circuit of my invention, the input transistor can be prevented from becoming saturated, an ordinary current gain $h_{fe}$ for the input transistor can be obtained, the input impedance of the base terminal of the input transistor is increased, and the base current can be reduced.

Because of this, the output voltage can be accurately output in the same manner as with ordinary output voltages, even during a low output voltage.

I claim:

1. An input signal processing circuit, comprising:

first and second terminals for respectively receiving first and second supply voltages;

an input terminal for receiving an input signal;

an input transistor, having a base coupled to the input terminal to receive the input signal, an emitter which outputs a current responsive to the level of the input signal, and a collector;

a first transistor having a base, an emitter coupled to the first terminal and a collector coupled to the collector of the input transistor;

a second transistor having a base coupled to the base of the first transistor, an emitter coupled to the first terminal, and a collector;

a third transistor having a base, an emitter coupled to the second terminal through a first resistor, and a collector coupled to a connecting point common with the base of the second transistor;

a fourth transistor having a base coupled to the base of the third transistor, an emitter coupled to the second terminal, and a collector coupled to its base and the collector of the second transistor; and a difference circuit, coupled between the collector of the input transistor and the collector of the third transistor, for generating a voltage difference responsive to a current flowing in the collector of the third transistor.

2. The circuit of claim 1 wherein the difference circuit comprises a second resistor coupled between the collectors of the input transistor and third transistor.

3. The circuit of claim 1 further comprising an adjusting circuit which lowers the voltages of the bases of the third and fourth transistors if the voltage of the input transistor's base approaches the second supply voltage.

4. The circuit of claim 3 wherein the adjusting circuit has a Schottky diode coupled between a common base connecting point of the third and fourth transistors and the base of the input transistor.

5. The input signal processing circuit of claim 1, wherein the difference circuit is operable to generate a voltage difference responsive to a current flowing in the collector of the third transistor such that a collector-emitter voltage of the input transistor is increased in response to the voltage difference.

6. A low voltage operating circuit with input saturation countermeasure, comprising:

a first supply terminal and a second supply terminal for respectively receiving first and second supply voltages;

an input terminal for receiving an input signal;

an input transistor, having a base coupled to the input terminal to receive the input signal, an emitter which outputs a first current responsive to the level of the input signal, and a collector;

a first transistor having a base, an emitter coupled to the first supply terminal and a collector coupled to the collector of the input transistor, operable to allow a second current to flow from the first supply terminal through the first transistor, a substantial portion of the second current thence flowing through the input transistor to form the first current;

a first circuit having a first terminal connected to the collector of the first transistor and having a second terminal connected to the base of the first transistor, operable to form a voltage difference across the first transistor in response to a second circuit; and the second circuit connected to the first circuit, operable to enter a latched state such that the voltage difference is formed in the first circuit in response to the second circuit being in the latched state, such that a collector-emitter voltage of the input transistor is increased by an amount equal to approximately the voltage difference, whereby when the input signal is approximately equal to the first supply voltage the input transistor does not saturate.

7. The low voltage operating circuit of claim 8 being a three terminal regulator, further comprising:

a second transistor connected to the first transistor to form a current mirror circuit connected to the input transistor;

a band gap circuit connected to the current mirror circuit; and an output transistor controllably connected to the band gap circuit, operable to conduct a third current from the first supply terminal to the second supply terminal in response to the band gap circuit.

8. A low voltage operating circuit with input saturation countermeasure, comprising:

a first supply terminal and a second supply terminal for respectively receiving first and second supply voltages;

an input terminal for receiving an input signal;

an input transistor, having a base coupled to the input terminal to receive the input signal, an emitter which outputs a first current responsive to the level of the input signal, and a collector;

a first transistor having a base, an emitter coupled to the first supply terminal and a collector coupled to the collector of the input transistor, operable to allow a second current to flow from the first supply terminal through the first transistor, a substantial portion of the second current thence flowing through the input transistor to form the first current;

a first circuit having a first terminal connected to the collector of the first transistor and having a second terminal connected to the base of the first transistor, operable to form a voltage difference across the first transistor in response to a second circuit such that a collector-emitter voltage of the input transistor is increased by an amount equal to approximately the voltage difference, whereby when the input signal is approximately equal to the first supply voltage the input transistor does not saturate; and the second circuit connected between the second terminal of the first circuit and the second supply terminal, wherein the first circuit and the second circuit are selected such that the voltage difference will not exceed approximately 0.2 volts.

* * * * *